(12) United States Patent
Bjesse

(10) Patent No.: US 8,627,260 B1
(45) Date of Patent: Jan. 7, 2014

(54) BIT-LEVEL SIMPLIFICATION OF WORD-LEVEL MODELS

(71) Applicant: Synopsys, Inc., Mountain View, CA (US)

(72) Inventor: Per Mattias Bjesse, Portland, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/665,800

(22) Filed: Oct. 31, 2012

(51) Int. Cl.
*G06F 9/455* (2006.01)
*G06F 17/50* (2006.01)

(52) U.S. Cl.
USPC ........... 716/132; 716/103; 716/104; 716/106; 716/136

(58) Field of Classification Search
USPC .................................. 716/103, 104, 106, 136
See application file for complete search history.

(56) References Cited

U.S. PATENT DOCUMENTS

| | | | |
|---|---|---|---|
| 7,222,317 B1 * | 5/2007 | Mathur et al. ................. | 716/107 |
| 7,343,575 B2 | 3/2008 | Bjesse et al. | |
| 7,512,912 B1 * | 3/2009 | Iyer ................................ | 716/136 |
| 7,673,257 B1 * | 3/2010 | Bains et al. ................... | 716/104 |
| 7,890,894 B2 | 2/2011 | Bjesse et al. | |
| 8,001,498 B2 | 8/2011 | Bjesse | |
| 8,104,000 B2 | 1/2012 | Bjesse | |
| 8,122,401 B1 * | 2/2012 | Chauhan et al. .............. | 716/107 |
| 2002/0138812 A1 * | 9/2002 | Johannsen ........................ | 716/5 |
| 2007/0016722 A1 * | 1/2007 | Lee et al. ....................... | 711/103 |
| 2008/0134114 A1 | 6/2008 | Bjesse et al. | |
| 2008/0144372 A1 * | 6/2008 | Lee et al. ................. | 365/185.03 |
| 2010/0077366 A1 | 3/2010 | Bjesse | |
| 2010/0107132 A1 * | 4/2010 | Bjesse ............................... | 716/5 |

\* cited by examiner

*Primary Examiner* — Jack Chiang
*Assistant Examiner* — Brian Ngo
(74) *Attorney, Agent, or Firm* — Adams Intellex, PLC

(57) ABSTRACT

Computer implemented techniques for simplification of models are disclosed including various manipulations that are useful in logic analysis, verification, and re-synthesis. A high word-level representation is obtained along with a bit-level design representation. A map between the word-level representation and the bit-level representation is produced. Optimizations are performed on the bit-level representation with the results being lifted and included in the word-level representation, based on the map. Similar optimizations are performed on the word-level representation and translated to the bit-level representation.

27 Claims, 10 Drawing Sheets

| WORD-LEVEL MODEL | BIT-LEVEL MODEL |
|---|---|
| I0(1) | BIT_0 |
| I1(1) | BIT_1 |
| OUTPUT OF AND GATE | BIT_2 = BIT_0 • BIT_1 |
| OUTPUT OF INVERTER (NOT) | BIT_3 = NOT(BIT_2) |
| A(32) = A[0...31] | BIT_6...BIT_36 |
| B(32) = B[0...31] | BIT_37...BIT_68 |
| OUTPUT OF MULTIPLIER 520 [0...31] | BIT_69...BIT_100 |
| C(32) = C[0...31] | BIT_101...BIT_132 |
| OUTPUT OF MULTIPLIER 550 [0...31] | BIT_133...BIT_164 |

*FIG. 6*

BIT-LEVEL SIMPLIFICATION OF WORD-LEVEL MODELS

FIELD OF ART

This application relates generally to semiconductor circuits and more particularly to bit-level simplification of word-level models.

BACKGROUND

Modern electronic systems are constructed from a variety of circuits based on digital, analog, and high frequency components. These systems are exceptionally complex, and therefore difficult and expensive to design. Two design approaches generally exist: top-down decomposition and bottom-up assembly of constituent components. Feature sizes of the components comprising such electronic systems are now routinely smaller than the wavelength of visible light. In addition, rapid market changes drive ever-increasing demand for performance, advanced feature sets, system versatility, and a variety of other system requirements. These demands often introduce contradictory design requirements into the design process. Logic systems are routinely constructed from tens or hundreds of millions of transistors. System designers are required to make significant tradeoffs in performance, physical size, architectural complexity, power consumption, heat dissipation, fabrication complexity, and cost, to name a few. Each design decision exercises a profound influence on the resulting electronic system. To handle such electronic system complexity, designers create specifications around which to design their electronic systems. The specifications attempt to balance the many disparate demands being made of the electronic systems to contain the exploding design complexity.

Logic system designers develop a system specification to which proposed designs must conform. Comparison of proposed designs to the specification helps ensure that the designs meet critical system objectives. This process of comparison is called verification. Logic systems may be described at a variety of levels of abstraction, from low-level transistor layouts to high-level description languages. Most designers describe and design their electronic systems at a high-level of abstraction using an IEEE Standard hardware description language (HDL) such as Verilog™, SystemVerilog™, or VHDL™. The high-level HDL is easier for designers to understand, especially for a vast system, and may describe highly complex concepts that are difficult to grasp using a lower level of abstraction. The HDL description may be converted into any of the other levels of abstraction that is helpful to the developers. For example, a high-level description may be converted to a logic-level description (RTL), a gate-level (GL) description, a layout-level description, or a mask-level description. Each lower level of abstraction introduces more detail into the design description. The lower-levels of abstraction may be generated automatically by computer, derived from a design library, or created by another design automation technique. Ultimately, it is critical to ensure that the performance of the resulting lower-level designs is still capable of matching the requirements of the system specification and still provides the desired logic function.

SUMMARY

Techniques implemented to prove correctness of electronic system designs are required to rewrite and manipulate models in order to simplify them by removing redundancy and merging internal equivalence points. Further, the computationally costly proving process must minimize proof duration and computational resource utilization. A computer-implemented method for design analysis is disclosed comprising: obtaining a high-level design which includes a word-level representation; obtaining a bit-level representation of the high-level design; determining a map between the word-level representation and the bit-level representation; optimizing the bit-level representation; and lifting results from the optimizing of the bit-level representation and including the results in the word-level representation based on the map.

The obtaining a bit-level design representation may comprise translating the word-level representation of the high-level design. The method may further comprise maintaining the map between the word-level representation and the bit-level representation. The optimizing may further comprise removing redundancy. The lifting of the results from the optimizing of the bit-level representation may include creating an isomorph of the bit-level representation within the word-level representation. Creating the isomorph may comprise taking constants from the bit-level representation and using those constants in the word-level representation. Creating the isomorph may comprise identifying nets from the bit-level representation that are merged, mapping bit-level nets that are merged to corresponding nets within the word-level representation, and merging the corresponding nets within the word-level representation. The method may further comprise optimizing the word-level representation. The method may further comprise translating the optimizing of the word-level representation onto the bit-level representation. The method may further comprise iterating between the optimizing the bit-level representation, the lifting the results from the optimizing of the bit-level representation, the optimizing the word-level representation, and translating the optimizing of the word-level representation onto the bit-level representation. The optimizing of the word-level representation may include re-writing an expression to simplify an equation. The re-writing may include removing redundancy in the word-level representation. The re-writing may include merging an internal equivalence point. The re-writing may include substituting a section of the word-level representation with a section from the bit-level representation. The high-level design may include a datapath. Superfluous terms of the bit-level representation may be removed from the word-level representation. The word-level representation may be rebalanced using mathematical identities to identify equivalences in bit-level equations of the bit-level representation. Bit-level equations of the bit-level representation may be solved to find constant values. Bit-level equations of the bit-level representation may be solved to find equivalences. The method may further comprise implementing a semiconductor design based on the lifting. The method may further comprise evaluating the bit-level representation and the word-level representation for equivalence.

In embodiments, a computer system for design analysis may comprise: a memory which stores instructions; one or more processors coupled to the memory wherein the one or more processors are configured to: obtain a high-level design which includes a word-level representation; obtain a bit-level representation of the high-level design; determine a map between the word-level representation and the bit-level representation; optimize the bit-level representation; and lift results from the optimizing of the bit-level representation and including the results in the word-level representation based on the map. In some embodiments, a computer program product embodied in a non-transitory computer readable medium for design simulation comprising: code for obtaining a high-level design which includes a word-level representation; code for obtaining a bit-level representation of the high-level design; code for determining a map between the word-level representation and the bit-level representation; code for optimizing the bit-level representation; and code for lifting results from the optimizing of the bit-level representation and including the results in the word-level representation based on the map.

Various features, aspects, and advantages of various embodiments will become more apparent from the following further description.

BRIEF DESCRIPTION OF THE DRAWINGS

The following detailed description of certain embodiments may be understood by reference to the following figures wherein:

FIG. 6 is an example table showing bit mappings.

DETAILED DESCRIPTION

Figure 1:
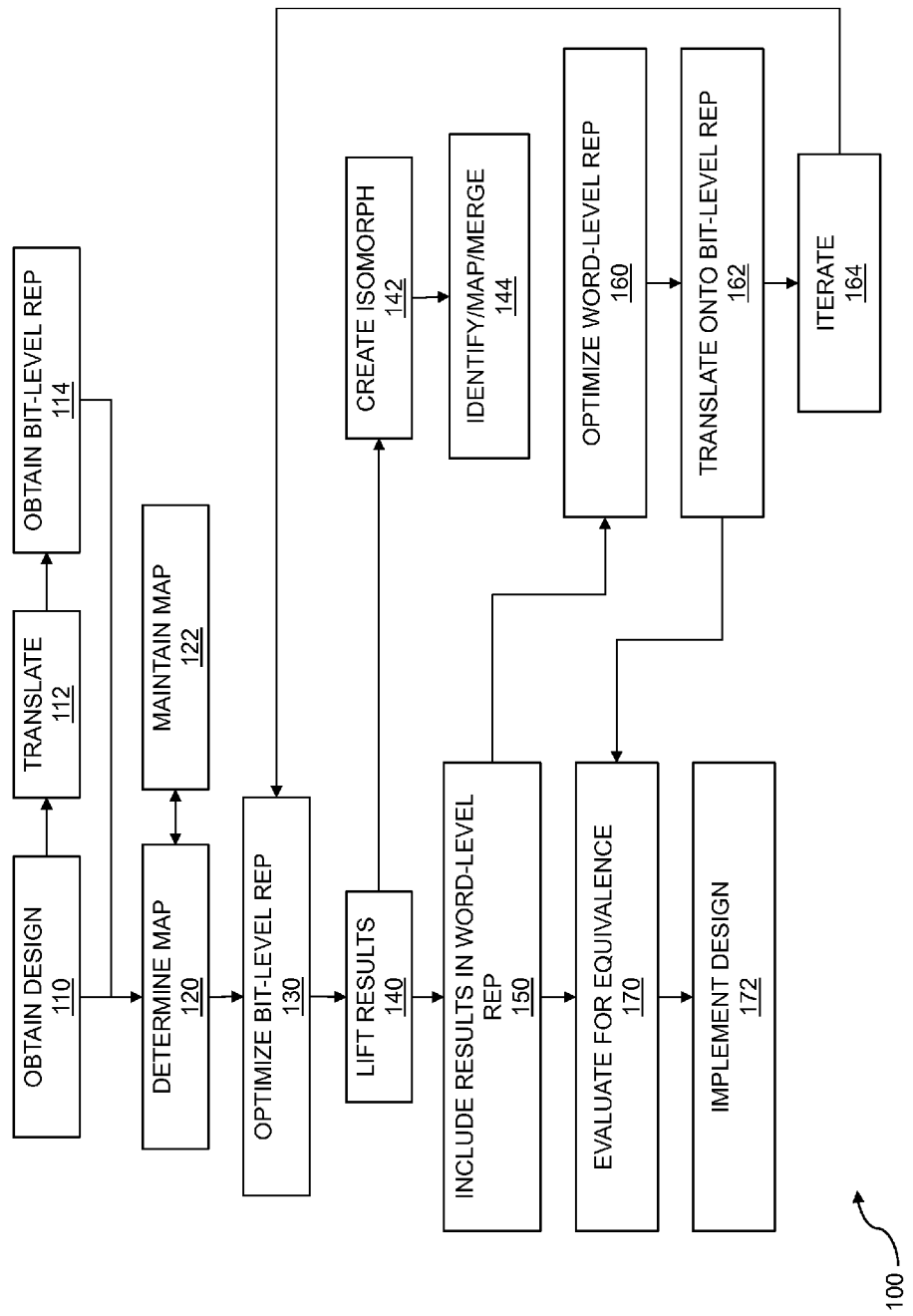
FIG. 1 is a flow diagram for bit-level simplification.

The design process for complex semiconductors includes numerous logic manipulations as well as thorough verification capabilities. The verification of modern electronic systems requires that a device under test (DUT) be simulated to the extent that the behavior of the DUT may be shown to match a specification for the electronic system. Part of this effort may involve optimization of various logic abstractions and then re-synthesis of the resulting logic implementation.

The verification process includes several tasks including estimation, simulation, and proof of correctness. Therefore, models of electronic systems are typically both written and manipulated at a high level. Attempts to prove the correctness of datapath-dominated designs include having word-level models describing the DUT be rewritten to render the problem in a simpler and more computationally efficient manner. Superfluous terms in a model, however, can render rules for rewriting as inapplicable. Therefore, extraneous terms should be removed before the rewrite rules are applied. This need renders removing redundancies and locating/merging internal equivalence points as critical modeling steps. Both the removing and locating steps are highly complex and costly from a computation perspective. Therefore, new, more efficient techniques which significantly reduce complexity and cost are therefore desired.

The disclosed concept includes rewriting of word-level models for datapath-dominated electronic designs in order to simplify the problem. Redundant term removal can be performed and internal equivalence points identified and merged. To remove unneeded terms and merge internal equivalence points, the word-level problem is translated to a bit-level problem. After this translation, maps can be maintained between the two models. High-speed rewriting and redundancy removal are performed on the bit-level model, and the results of the bit-level rewriting and redundancy removal are lifted up to the word-level model. An isomorphic word-level design can be created to aid in this process. If multiple components of the word-level model are mapped to the same bit-level nets, on a bit for bit basis, then those components can be merged. Additionally, if it is discovered that components of the bit-level model resolve to a constant, then the corresponding word-level components receive constant values as well. In this manner, word-level rewriting, and other word-level analysis, follows model rewriting and simplification at the bit-level. Similar optimizations at the word level can be translated down to a bit-level representation. The bit-level representation can then be further optimized and the result lifted to the word-level representation. In this manner bit-level representations and word-level representations can be iterated and further improved in a quick fashion.

Computational efficiency is critical to effective logic manipulation and proof of correctness for system designs, particularly when those designs are datapath dominated. Superfluous terms often appear in a system model, preventing the application of model rewrite rules. Therefore, it is necessary to remove model redundancy and to merge internal equivalence points so that rewriting becomes possible. However, redundancy removal and equivalence point merging is very costly. Instead, a word-level problem may be translated to a bit-level problem while maintaining maps between the two models. To achieve this congruency of models, high-speed rewriting and redundancy removal procedures are applied to simplify the bit-level model. Afterwards, the result may be applied to the word level model, forming a word-level model optimized with results lifted from the bit level model. In some cases an isomorphic word-level design is created, except for where components are merged or a constant value is replaced or some other optimization is identified on the bit level. Following bit-level simplification and lifting corresponding changes up to the word-level, word-level rewriting and other word-level analysis may proceed.

FIG. 1 is a flow diagram for bit-level simplification. A flow 100 is described for bit-level simplification of word-level models. The flow 100 may describe a computer-implemented method for design analysis. The flow 100 includes obtaining a high-level design 110 which includes a word-level representation. The high-level representation that is obtained may comprise a word-level design written in any of a variety of languages, including Verilog™, VHDL™, SystemVerilog™, SystemC™, or other language. In many cases the high-level design includes a datapath.

The flow 100 may include translating 112 the obtained design representation to a bit-level representation. The translation 112 may take as input an obtained representation and may produce a bit-level representation. Bits of a bit-level representation may be assigned to correspond to input variables of a word-level representation. For example, individual bits of a bit-level representation may be assigned to individual, single-bit variables of a word-level representation. Similarly, multiple bits of a bit-level representation may be assigned to multiple-bit variables of a word-level representation. The bit mappings, in many cases, are unique.

The flow 100 includes obtaining a bit-level representation 114 of the high-level design. The bit-level representation can be obtained from a representation stored in memory, generated by an EDA tool, written directly in a bit-level language, and so on. The obtaining of a bit-level design representation 114 may comprise translating the word-level representation of the high-level design. In other embodiments, a bit-level representation can be obtained by translation of a high-level representation written in, for example, an IEEE Standard HDL or other high-level language convenient to modeling.

The flow 100 includes determining a map 120 between the word-level representation and the bit-level representation. A map can indicate relationships between bits of a bit-level model and a word-level model, relationships between logic gates and logic blocks, and so on. A map can also indicate which portions of a word-level representation correspond to which portions of a bit-level representation. In addition to determining a map, the flow 100 includes maintaining the map 122 between the word-level representation and the bit-level representation. Maintaining a map 122 can be important given bit-level simplifications and manipulation, word-level simplifications and manipulations, and so on.

The flow 100 continues with optimizing the bit-level representation 130 and may comprise bit-level rewriting. Optimization of a bit-level representation may further comprise redundancy removal. Any techniques appropriate to bit-level simplification may be applied. Optimization may be performed repeatedly as a result of iteration 164.

The flow 100 continues with lifting results 140 from the optimization of the bit-level representation. Simplifications performed on a bit-level model are lifted up in such a way that simplifications may be applied to a word-level representation and may be based on the mapping. The uplifting may include results from rewriting, redundancy removal, internal equivalence merging, and the like. The lifting of the results 140 from the optimizing of the bit-level representation may include creating a lifted version of the model or an isomorph 142, or something similar to an isomorph, of the bit-level representation within the word-level representation. The result created in the word-level representation may have components which are merged or a constant value which is replaced or some other optimization that is identified.

The lifted version may be a model of a word-level representation and may be further simplified as part of an optimization process. The creating of the lifted version may comprise taking constants from the bit-level representation and using those constants in the word-level representation. An optimization may comprise further rewriting, redundancy removal, merging of internal equivalence points, and the like. Nets from the bit-level representation may be identified and merged with a mapping of the bit-level nets to the corresponding nets within the word-level representation with merging the corresponding nets 144 within the word-level representation. The optimization may further comprise identifying improvements, mapping, and merging of redundancies 144.

The flow 100 continues with including results in the word-level representation 150 based on the map. Results from high-speed rewriting and redundancy removal at a bit-level and that were lifted up to a word-level may be applied to a word-level representation. For example, constants that are discovered in a bit-level representation may be lifted up to a word-level representation where word-level variables corresponding to bit-level constants are similarly set to constants.

The flow 100 continues with optimizing the word-level representation 160. Various rewriting rules may be applied to a word-level representation in order to simplify the word-level representation. In some cases superfluous terms of the word-level model are removed from the word-level model. Further, optimization techniques may be applied to aid in other objectives, examples including but not limited to computational optimization, evaluation of equivalence, and the like. In embodiments, mathematical properties are applied to rewriting and optimization. For example, the commutative property of multiplication may be applied to reorder variables in order to make computation of equivalence simpler. Results of the optimization of a word-level representation may be translated onto a bit-level representation 162. The resulting bit-level representation may be analyzed for simplification, rewriting, and the like. Further, the resulting bit-level representation may assist in evaluation for equivalence. The flow 100 may further comprise iterating 164 between the optimizing the bit-level representation, the lifting the results from the optimizing of the bit-level representation, the optimizing the word-level representation, and translating the optimizing of the word-level representation onto the bit-level representation. Iteration 164 may further assist model simplification, rewriting, optimization, and the like. Iteration may not occur for some simplification functions, while for others it may occur one or more times.

The flow 100 may continue with evaluating the bit-level representation and the word-level representation for equivalence 170 where the equivalence may be part of a verification process. In many cases the bit-level representation and word-level representation are equivalent on a correct by construction basis. Therefore, in many embodiments equivalence checking is not needed at this point in the flow 100. However, significant changes may have been made to a bit-level representation as a result of rewriting, redundancy removal, internal equivalence point merging, simplification, identification of constants, and the like. Similarly, a word-level representation may have undergone significant changes as a result of the lifting up of the results from a bit-level representation to a word-level representation. Thus equivalence between representations may be useful to the design process. Equivalence may be evaluated in a variety of ways including bit-level equivalence, word-level equivalence, high-level equivalence, and the like. The flow 100 may continue with implementing a semiconductor design based on the lifting. Various steps in the flow 100 may be changed in order, repeated, omitted, or the like without departing from the disclosed inventive concepts. Various embodiments of the flow 100 may be included in a computer program product embodied in a non-transitory computer readable medium that includes code executable by one or more processors.

Figure 2:
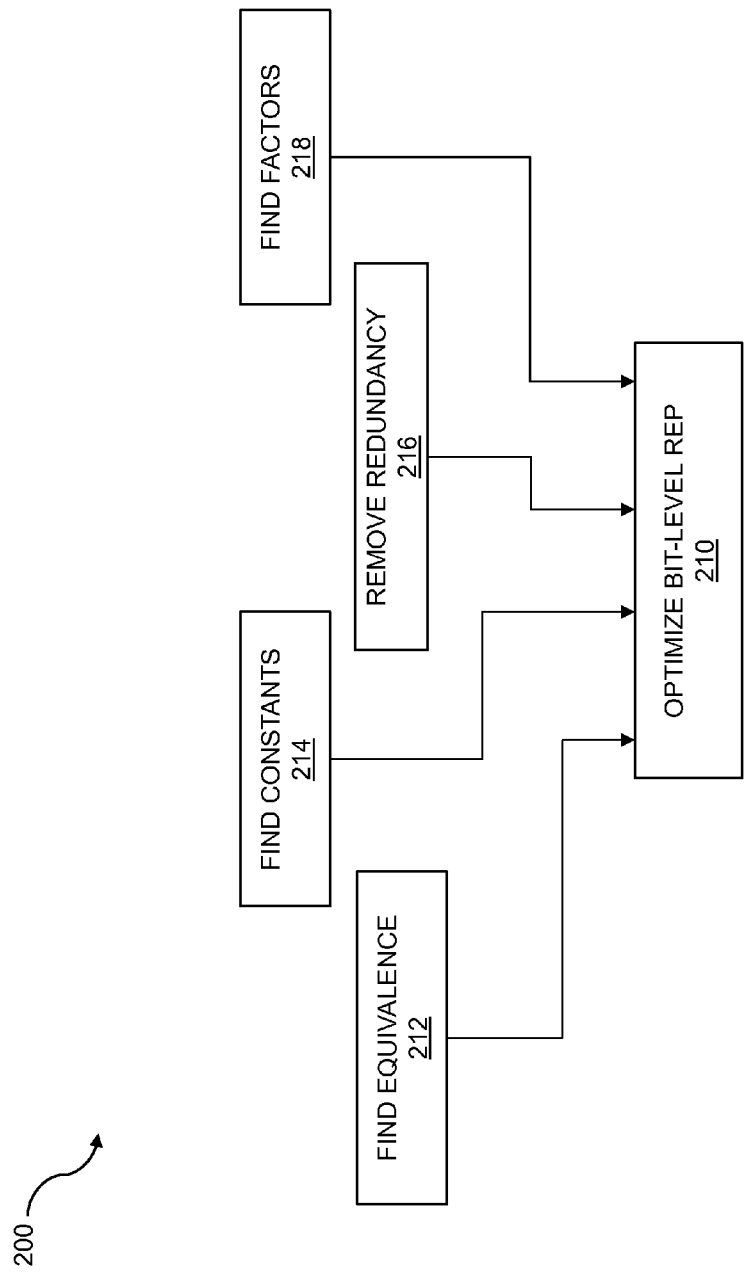
FIG. 2 is a flow diagram for bit-level optimization.

FIG. 2 is a flow diagram for bit-level optimization. A flow 200 may continue from or be part of the previously described flow 100. In some embodiments, the flow 200 stands on its own and works from pre-existing bit-level representations, system designs, and the like. The flow 200 begins with optimizing a bit-level representation 210 by various techniques. Optimization of a bit-level representation may involve a variety of operations including high-speed rewriting, redundancy removal, merging internal equivalence points, identification of constants, and the like. High-speed rewriting can include taking a normalized bit-level representation and applying rules for analyzing the bit-level representation. These rules can identify representation manipulations that are quickly and repeated performed. By way of example, a high-speed rewriting rule can look down through two levels of hierarchy to rearrange operands frequently encountered. Numerous other high-speed rewriting rules are possible and frequently beneficial. In order to undertake optimization of a bit-level representation, various other analysis steps may be taken.

The flow 200 may include finding equivalence 212. For example, internal model equivalence points may be found 212 as part of the analysis of a bit-level model. If such points are identified, data about the points may be used to optimize a bit-level representation. The flow 200 may include finding constants 214. In embodiments, bit-level equations of a bit-level representation are solved to find constant values 214. If such constants are identified, data about the constants may be used to optimize a bit-level representation by removing logic a constant has caused to be ignored. The flow 200 may include removing redundancy 216. For example, portions of a bit-level representation may be identified to be redundant as a result of analysis, simplification, and the like. If such redundancy is identified, data about the redundancies may be used to optimize a bit-level representation by removing logic found to be redundant. The flow 200 may include finding other factors 218 where the other factors might include identifying portions of logic that may be inactive due to an idle or disabled clock. If such logic is identified, data about the logic may be used to optimize a bit-level representation by removing logic found to be inactive, for example. Further, the bit-level representation may be analyzed from a graph perspective. A portion of the graph, or sub-graph, may be simplified and this simplification included in the bit-level representation. Various steps in the flow 200 may be changed in order, repeated, omitted, or the like without departing from the disclosed inventive concepts. Various embodiments of the flow 200 may be included in a computer program product embodied in a non-transitory computer readable medium that includes code executable by one or more processors.

Figure 3:
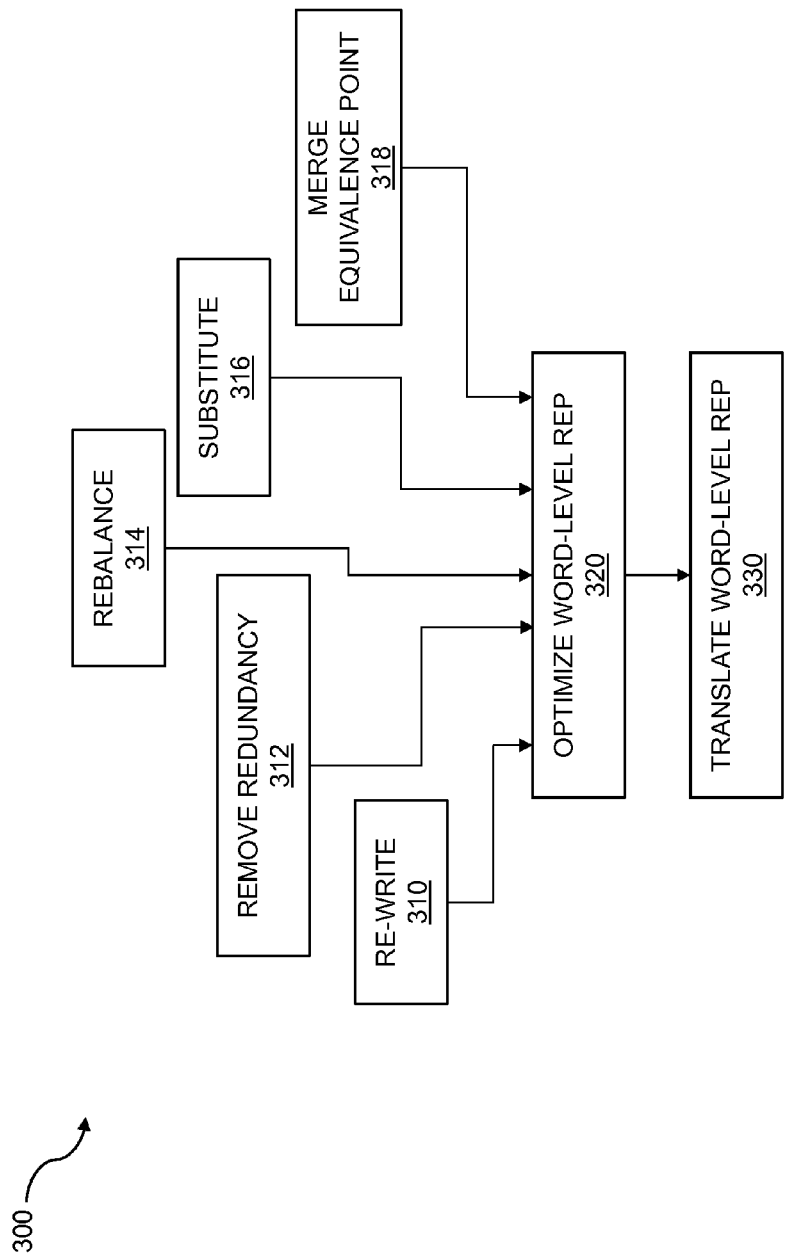
FIG. 3 is a flow diagram for word-level optimization.

FIG. 3 is a flow diagram for word-level optimization 300. A flow 300 may continue from or be part of the previously described flow 100. In some embodiments, the flow 300 stands on its own and works from pre-existing word-level representations, system designs, and the like. A flow 300 begins with optimizing the word-level representation 320. Optimization of a word-level representation may involve a variety of operations. In order to accomplish the optimization of a bit-level representation, various analysis steps may be taken.

The flow 300 may include rewriting an expression 310 to simplify an equation. In embodiments, various logic minimization techniques such as the Quine-McCluskey algorithm are used to rewrite logic functions of a word-level representation. The flow 300 may include removing redundancy 312 in the word-level representation. In embodiments, the optimization of a word-level representation seeks for constant variables. When, in embodiments, constant variables are found, expressions that use a constant are simplified, removed, or otherwise manipulated. The flow 300 may include rebalancing 314. In embodiments, the word-level representation can be rebalanced 314 using mathematical identities to identify equivalences in the bit-level equations of the bit-level representation. For example, the commutative property of multiplication may be applied to reorder variables in an expression, and the like. The equivalences in the bit-level representation may then be lifted up to the word-level representation to aid with the rebalancing of the word-level representation. The flow 300 may include merging an internal equivalence point 318. When components of a word-level representation may be mapped to the same bit-level nets for all bits, the components may be merged and a simplified word-level representation may be achieved. The flow 300 may include substituting 316 a section of the word-level representation with a section from the bit-level representation. Thus, a section of the bit-level representation can be lifted from the bit-level representation into the word-level representation and replace that section. Such replacement can be based on the mapping between the bit-level representation and the word-level representation.

The flow 300 continues with translating the optimizing of the word-level representation 330 onto the bit-level representation. The translating may comprise assigning bits of a bit-level representation to each variable of a word-level model. Bits of a bit-level model may be associated with bits and varying width words, for example, of a word level model. Bits of a bit-level model may map uniquely to variables of a word-level model. Various steps in the flow 300 may be changed in order, repeated, omitted, or the like without departing from the disclosed inventive concepts. Various embodiments of the flow 300 may be included in a computer program product embodied in a non-transitory computer readable medium that includes code executable by one or more processors.

Figure 4:
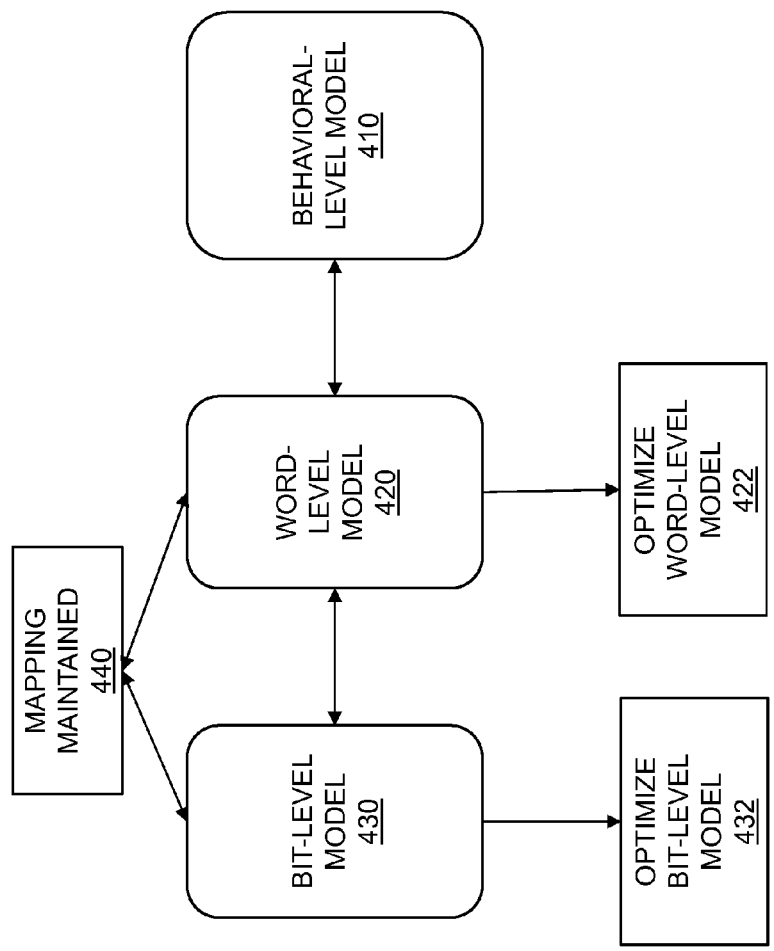
FIG. 4 is a diagram showing optimizing and mapping.

FIG. 4 is a diagram showing optimizing and mapping. A designer may start with a behavioral-level model 410 using VHDL™, Verilog™, SystemVerilog™, SystemC™, or some other language. A word-level model 420 may be generated from the behavioral-level model 410 using various design automation tools. A bit-level model 430 may be generated from the word-level model 420 using various design automation tools. In some cases the word-level model 420 can be generated on its own by designers or may be derived from the bit-level model 410. In some cases the bit-level model 430 can be generated on its own by designers. Verification can involve checking the behavioral-level model 410 against the word-level model 420 to see that the two models match. Verification can involve checking the word-level model 420 against the bit-level model 420 to see that the two models match. Because of the different characteristics of the different levels of abstraction, different optimization techniques can be used at each level. In the disclosed concept, optimization of the bit-level model 432 is performed. A mapping is maintained 440 between the bit-level model 430 and the word-level model 420. For the bits in the bit-level model 430, corresponding words or bits are identified in the word-level model 420. Changes to the bit-level model 430 are lifted (or translated) to the word-level model 420. Thus, optimizations at the bit-level are incorporated to the word-level. Likewise, optimization of the word-level model 422 can be performed. The mapping between the bit-level model 430 and the word-level model 420 can similarly be used to translate changes to the word-level model 420 to the bit-level model 430. The optimizing can include equivalence identification, logic reduction, Boolean analysis, constant evaluation, and other types of logic and circuit optimization. By optimizing at the bit-level model and word-level model levels and then reflecting changes to the other level through the mapping to the other level optimization and re-synthesis can be significantly improved.

Figure 5:
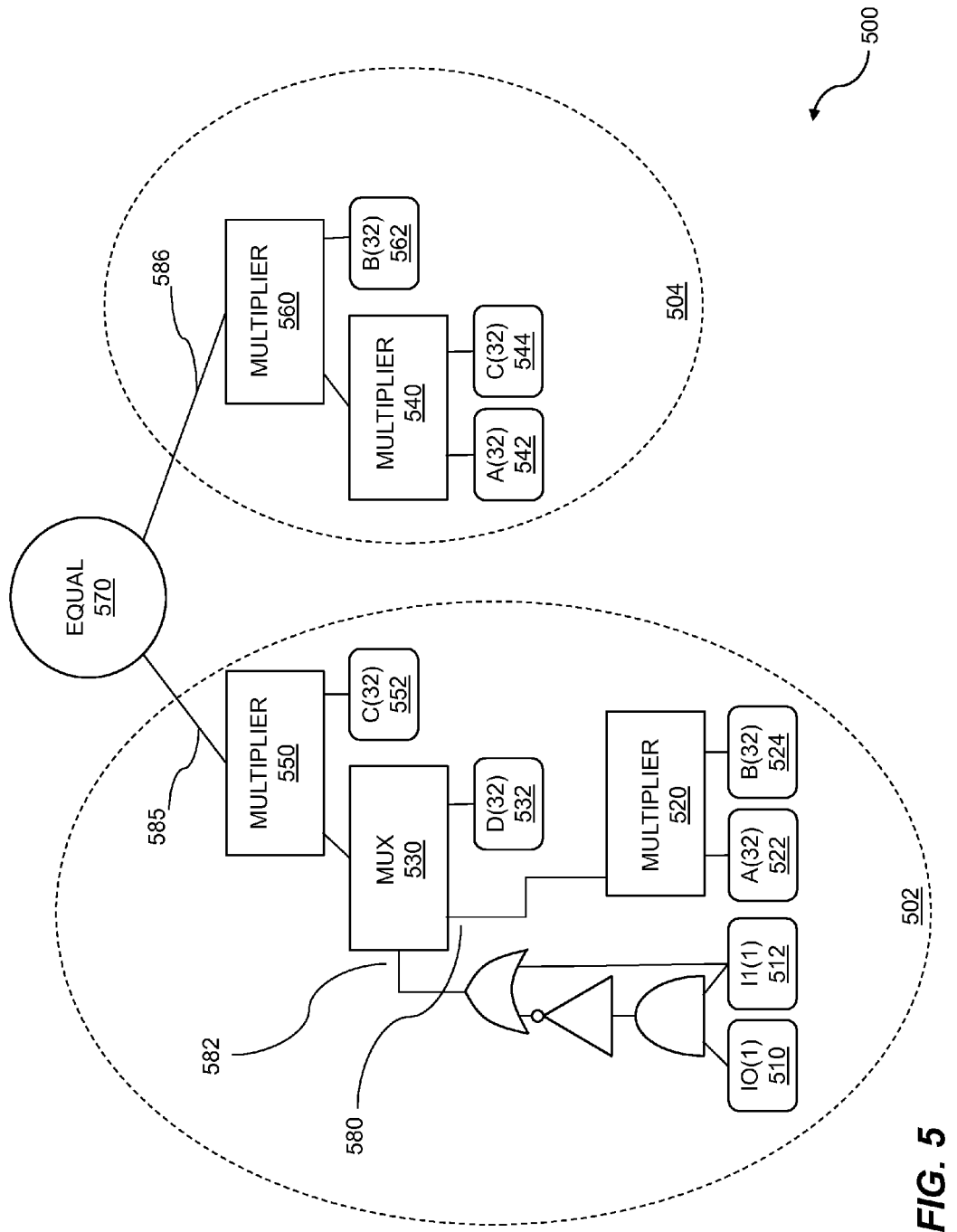
FIG. 5 is an example diagram of a top-level problem.
Figure 7:
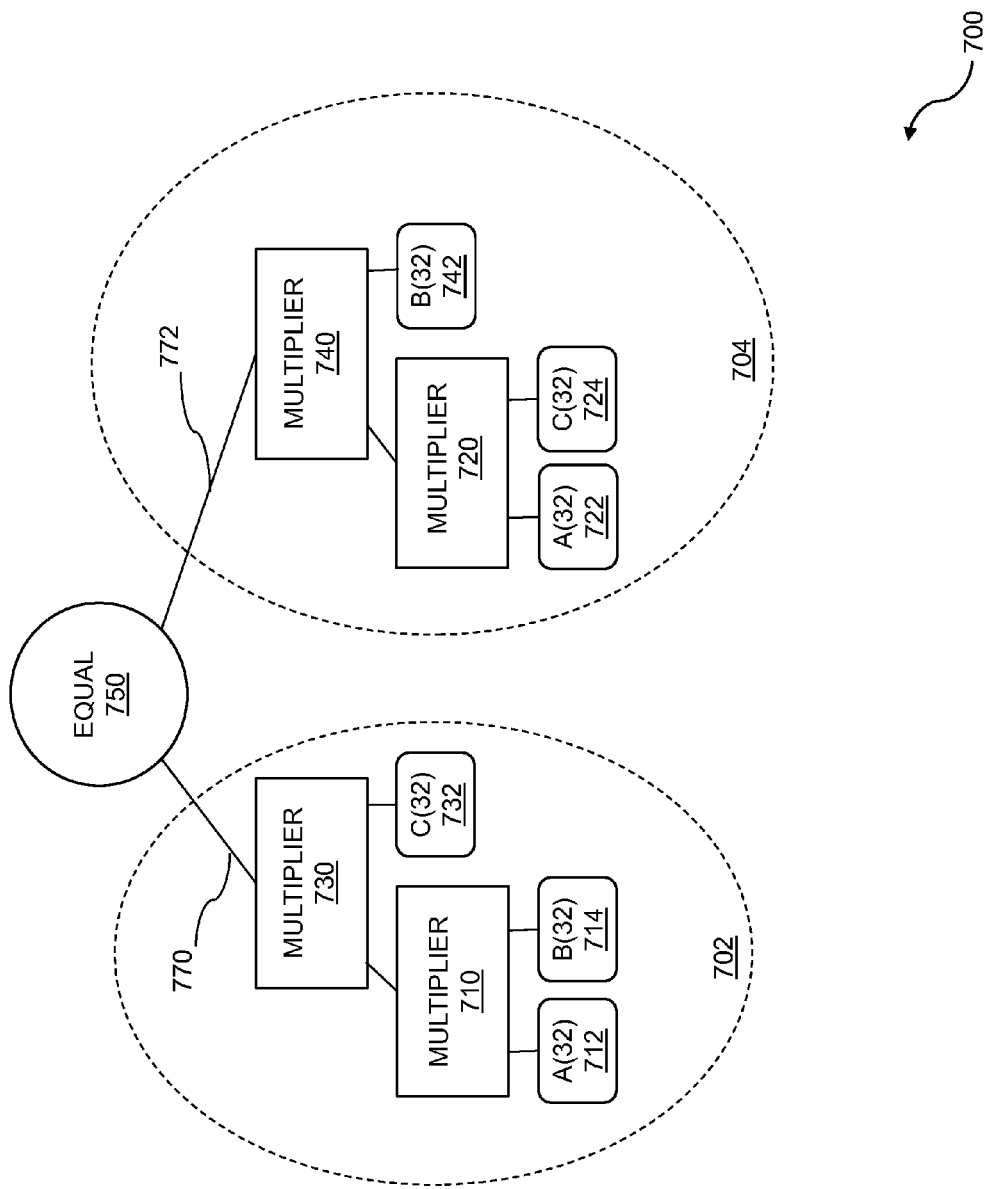
FIG. 7 is an example diagram with reduction due to bit-level constant.
Figure 8:
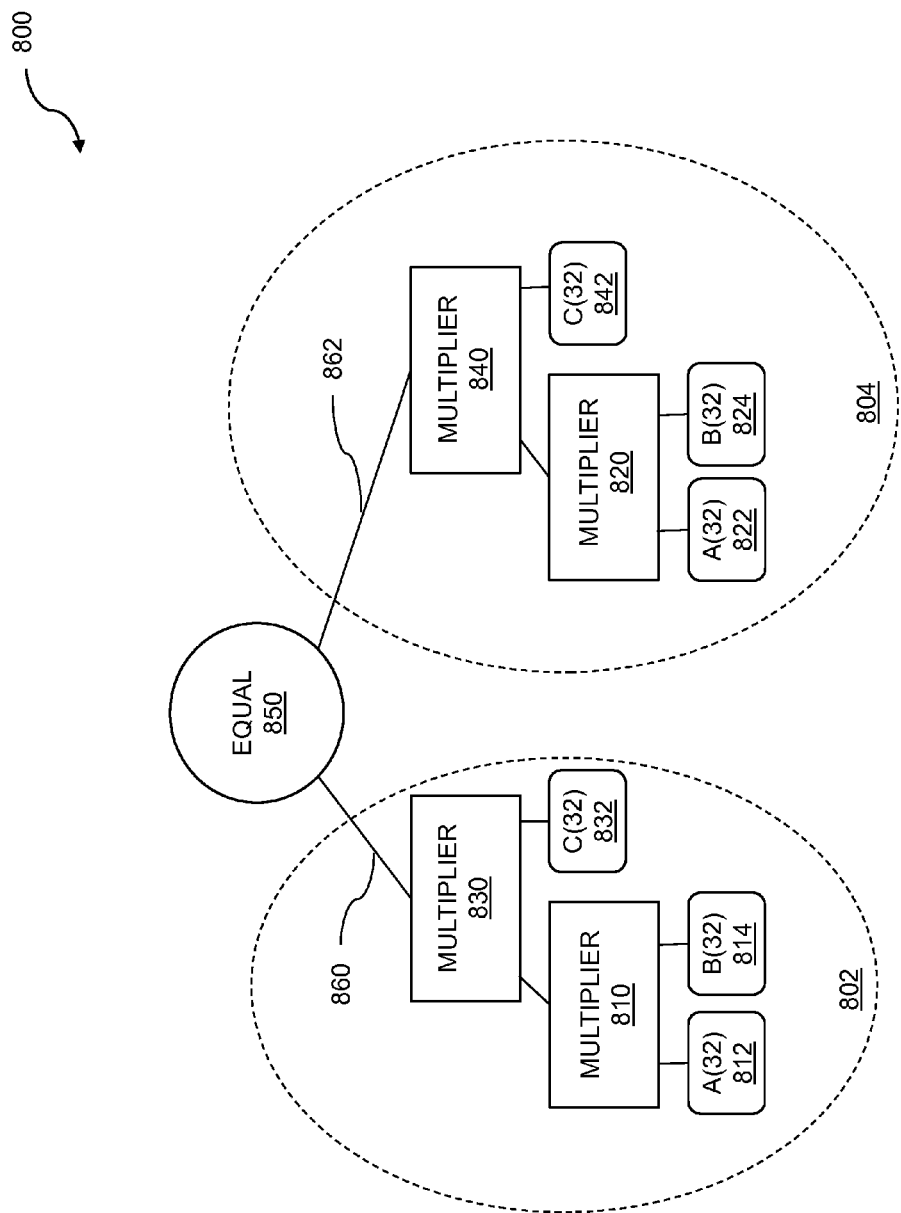
FIG. 8 is an example diagram with word-level model rewriting.
Figure 9:
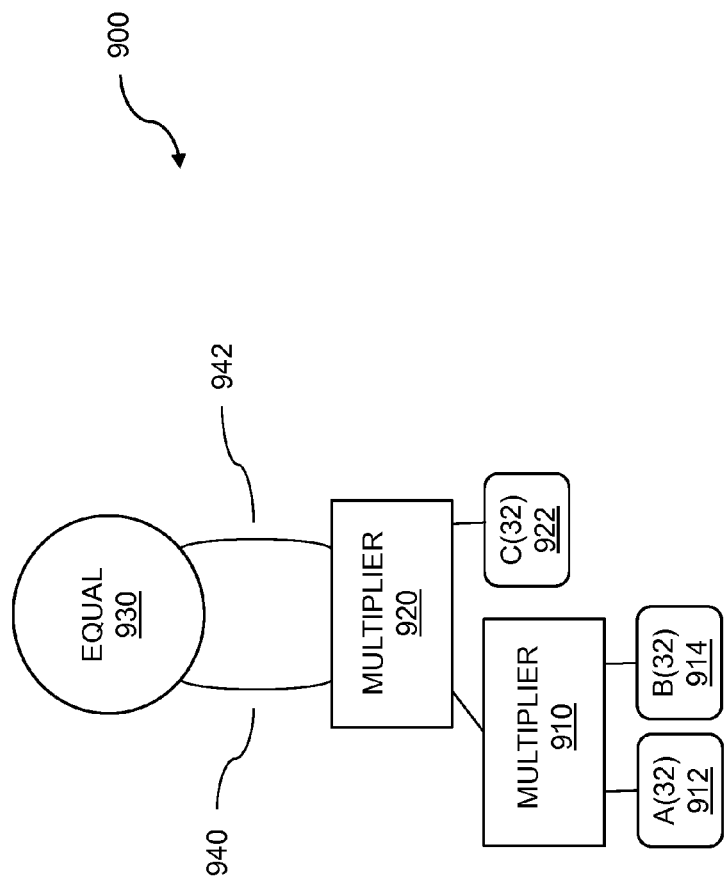
FIG. 9 is an example diagram with equivalence detected.

FIG. 5 is an example diagram of a top-level problem 500. The top-level problem 500 is illustrative of some of the types of optimizations that can be applied to a word-level model and similar rearrangements are also possible for bit-level models. The example top-level model 500 can be a high-level model written, for example, in an IEEE Standard HDL such as Verilog™, SystemVerilog™, or VHDL™ including descriptions of a system structure and function. FIG. 6 provides a mapping while FIGS. 7 through 9 provide example manipulations that are exemplary but are not shown by way of limitation.

The example top-level problem 500 is shown in which the equivalence of models is evaluated. A model on the left-hand side 502 may represent any model including a detailed system design, while the model on the right-hand side 504 may show a simplified model, a reference model, a model generated by an EDA tools, and the like, against which equivalence is to be evaluated. The objective of the problem 500 is to determine whether the left hand model 502 is equivalent to the right hand model 504. This problem 500 may be part of a verification procedure.

In embodiments, a bit-level design (not shown) may be obtained for analysis as part of the equivalence determination. The obtaining of a bit-level design representation may comprise translating the word-level representation of the high-level design. The bit-level representation could include each gate and each net connection between the gates.

The left-hand side 502 of example 500 may show a model comprising logic, while the right-hand side 504 may show a word-level model. In embodiments, both the left-hand side 502 and the right-hand side 504 may be word-level representations. In some cases the right-hand side 504 can be a behavioral description. In this situation the left-hand side 502, a word-level representation, would be compared against the right-hand side 504 the behavioral description. Equivalence could be checked between these two representations.

Any appropriate abstraction can be used on either a left-hand side 502 or a right-hand side 504. Beginning with the left-hand side 502, there are various inputs. Inputs may be bits, words, strings, or any other appropriate input to a given model. For example, bit inputs I0(1) 510 and I1(1) 512 may be single-bit inputs to logic gates. 32-bit word inputs A 522 and B 524 may represent inputs to a logic block such as a Multiplier 520. Any appropriate width word inputs may be provided to the logic. An output 582 of logic and an output 580 of other logic is connected to other logic including a MUX 530. In this example, the logic output 582 is connected to a control input of a multiplexer the MUX 530 and the output 580 of other logic connected to another side's input of the MUX 530. The MUX 530, in this case, represents a 32-bit wide set of multiplexors where one 32-bit word or the other 32-bit word is selected for propagation. Another 32-bit word input D 532 is connected to the other side input of a MUX 530. In the example shown, the output 582 of combinational logic 582 is always true based on the AND-Inverter-OR gate combination. As a result, one side of the multiplexer 530 is always selected. The model 502 can be simplified as a result which reduces the complexity of the model. For the example shown, input D 532 cannot be selected based on the control logic feeding the MUX 530 selector input. Continuing, the 32-bit wide output of MUX 530 is connected to an input to a Multiplier 550. Another input to the Multiplier 550 is a 32-bit wide word input C 552. An output 585 of the Multiplier 550 is connected to an input of an equality evaluator Equal 570. In this case the Equal 570 function is a verification capability abstraction within a design automation tool rather than a logic component configuration. The signal 584 may be compared for equality with another signal 586, which is the output of right-hand side 504.

Continuing, the right-hand side 504 of the example problem 500 may show a model to which equality is to be demonstrated. There are inputs to various elements of the right-hand model 504. Inputs may be bits, words, strings, and any other input appropriate to a given model. For example, word inputs A 552 and B 544 represent 32-bit inputs to a logic block such as Multiplier 550. In this case input A 542 is the same as input A 522 previously discussed. An output of the Multiplier 540 is connected to a Multiplier 560. Another word input B 562 is connected to the Multiplier 560. An output 586 of the Multiplier 560 is connected to an input of the equivalence calculator Equal 570. In the example given, if the signal 584 is calculated to be equivalent to the signal 586 then the two sides of the problem 500 are equivalent.

FIG. 6 is an example table 600 showing word-level to bit-level mappings. A high-level model may be obtained, and include signals comprising, bits and words. By mapping between a word-level model and a bit-level model optimizations in one level may be translated to the other level. In many cases the bit-level model will be derived from a word-level model where the word-level model was used to generate a corresponding bit-level model using a design automation tool. Each variable in a word-level model may be assigned signals in a bit-level model. FIG. 6 shows an example table which represents a mapping between variables of a word-level model and bits of a bit-level model. A single-bit variable, I0(1) is associated with a bit BIT_0. Another single-bit variable I1(1) is associated with a bit BIT_1, and so on. Multi-bit variables of a word-level model are associated with multiple bits in a bit-level model. For example, a variable in a word-level model such as A(32) is assigned bits in a bit-level model, such as BIT_5, BIT_6, . . . BIT_36. Continuing, outputs of logic in a word-level model are represented by bits in the bit-level model. For example, "Output Of And Gate" in the word-level model maps to BIT_2 in the bit-level model, where BIT_2=BIT_0·BIT_1. Each variable of the word-level model may similarly map to a bit or a plurality of bits in the bit-level model.

FIG. 7 is an example diagram with reduction. The top level problem 700 is a reduction from the previous top level problem 500. The reduction can be accomplished due to a bit-level constant, as will be seen. Equations may be solved to find constant values and resulting logic optimizations may be produced. Solving bit-level equations may reveal constants, redundancies, simplifications, and the like. Any simplifications found at one level may be translated to another level with resulting simplification. In FIG. 5, for example, a selection signal input to the Multiplexer 530 was discovered to be a constant. The AND-Inverter-OR combination resulted in signal 582 to always be in the "1" state. Based on this constant value, the AND-Inverter-OR combination as well as the MUX 530 could be removed. This type reduction could be a good example of bit-level representation reduction. The reduction could then be translated to a corresponding word-level representation model.

Based on the reduction in logic, left-hand side 502 from the previous top level model 500 becomes a new left-hand side 702. While left-hand side 702 does not match right-hand side 704, the logic arrangement can be seen to be similar. For the left-hand side 702 32-bit wide inputs A 712 and B 714 are connected to a Multiplier 710 with a corresponding output going into a Multiplier 730. The other input to Multiplier 730 is a 32-bit wide input C 732. On the right-hand side 704, 32-bit wide inputs A 722 and C 724 are connected to a Multiplier 720 with a corresponding output going into a Multiplier 740. The other input to Multiplier 740 is a 32-bit wide input B 742. The output of the multiplier 730, signals 770, are evaluated for equivalence to signals 762 using the Equal 750 abstraction, similar to that described earlier in FIG. 5.

FIG. 8 is an example diagram with word-level model rewriting 800. The top level problem 800 is a rearrangement from the previous top level problem 700. A left-hand side 802 and a right-hand side 804 are shown where equivalence is being checked through an Equal 850 abstraction using signals 860 and signals 862. In the previous left-hand side 702, (A*B)*C was shown using Multiplier 710 and Multiplier 730. In the same manner (A*B)*C is now shown using Multiplier 810 and Multiplier 830. The A 812, B 814, and C 832 inputs are each 32 bit-wide words. In the previous right-hand side 704, (A*C)*B was shown using Multiplier 720 and Multiplier 740. Now the right-hand side 804 word-level representation has been rearranged to by (A*B)*C using Multiplier 820 and Multiplier 840. The A 822, B 824, and C 842 inputs are each 32 bit-wide words and this case correspond to the A 812, B 814, and C 832 inputs. The rearrangement is an example and is based on the commutative properties of multiplication. Other similar types of rearrangements are possible. By performing this rearrangement of the right-hand side 804, the left-hand side 802 and the right-hand side 804 become isomorphic representations. In the case of top level problem 800, the left-hand side 802 and right-hand side 804 are word-level isomorphs. When a bit-level model and a word-level model are being manipulated a lifted version representation can similarly be created between the bit-level representation and the word-level representation.

FIG. 9 is an example diagram with equivalence detected. An example 900 is shown in which the previous left-hand side 802 and the previous right-hand side 804 are shown to be equivalent. A 32-bit wide word A 912 input and a 32-bit wide word B input 914 are applied to Multiplier 910. A 32-bit wide word C 922 is multiplied with the resulting word using Multiplier 920. The signals 860 and signals 862 are abstracted to be signals 940 and signals 942 which are actually the same signals resulting in a detected equivalence using the Equal 930 abstraction.

Figure 10:
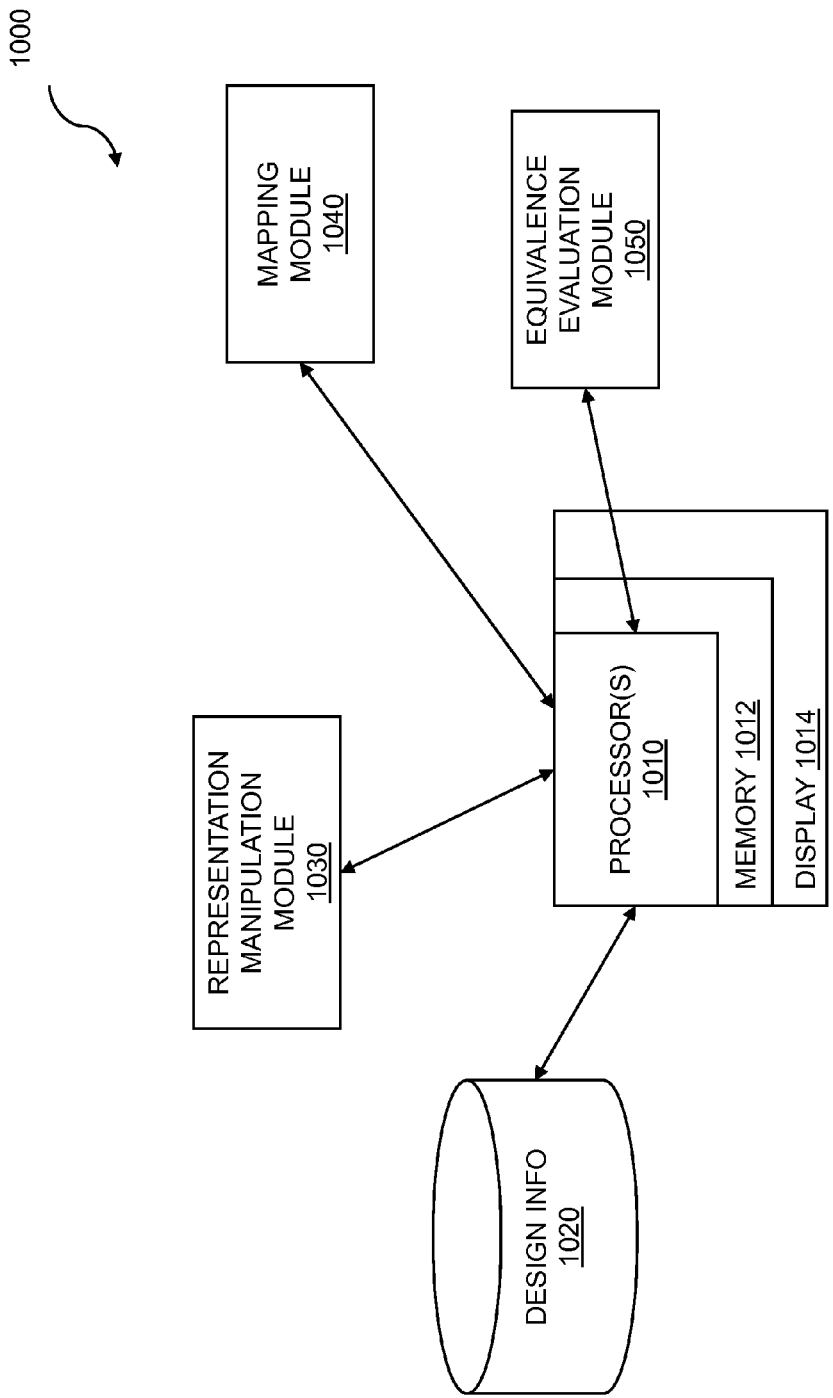
FIG. 10 is a system diagram for bit-level and word-level manipulation.

FIG. 10 is a system diagram for bit-level and word-level manipulation. A system 1000 may comprise one or more processors 1010 coupled to a memory 1012 and a display 1014. The one or more processors 1010 may be coupled to a representation manipulation module 1030, a mapping module 1040, and an equivalence evaluation module 1050. In at least one embodiment, the one or more processors 1010 may accomplish the representation manipulation, mapping, and equivalence evaluation functions. The one or more processors may access a design information storage 1020 that includes a high-level design. The one or more processors 1010 may be configured to obtain a high-level design which includes a word-level representation, obtain a bit-level representation of the high-level design, determine a map between the word-level representation and the bit-level representation, optimize the bit-level representation, lift results from the optimizing of the bit-level representation, and including the results in the word-level representation based on the map. The word-level representation may be rendered in an IEEE Standard hardware description language (HDL) such as Verilog™, System-Verilog™, and VHDL™. A bit-level representation may be obtained, may be generated from the word-level representation, may be derived by a design tool, or may be otherwise procured. The word-level and bit-level representations may be manipulated to remove superfluous terms, remove redundancy, rewrite a model, and the like. The system 1000 may be configured to determine a mapping 1040 representation between the bit-level representation and the word-level representation 1030. A lifted model may be created wherein components which are mapped to the same bit-level nets for all bits may be merged, and where word-level signals with a bit-level implementation which has been discovered to be constant may receive word-level constant values. The system 1000 may be configured to evaluate equivalence. Equivalence may be determined between a word-level model and an isomorphic word-level model which has been simplified, and the like. In embodiments, the determining of equivalence is used for simplifying models.

The one or more processors 1010 may be coupled to the memory 1012 which stores design data, instructions, system support data, intermediate data, analysis results, and the like. The one or more processors 1010 may be coupled to an electronic display 1014. The display 1014 may be any electronic display, including but not limited to, a computer display, a laptop screen, a net-book screen, a tablet computer screen, a cell phone display, a mobile device display, a remote with a display, a television, a projector, or the like.

The system 1000 may include a computer program product. The computer program product may comprise code for obtaining a high-level design which includes a word-level representation; code for obtaining a bit-level representation of the high-level design; code for determining a map between the word-level representation and the bit-level representation; code for optimizing the bit-level representation; and code for lifting results from the optimizing of the bit-level representation and including the results in the word-level representation based on the map.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system" —may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions are stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer enables execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer-implemented method for design analysis comprising:
obtaining a high-level design which includes a word-level representation;
obtaining a bit-level representation of the high-level design;
determining, using one or more processors, a map between the word-level representation and the bit-level representation;
optimizing the bit-level representation; and
lifting results from the optimizing of the bit-level representation and including the results in the word-level representation based on the map wherein the lifting includes creating an isomorph of the bit-level representation within the word-level representation and where the creating an isomorph includes mapping bit-level nets to corresponding nets within the word-level representation where the bit-level nets are merged, identifying nets from the bit-level representation that are merged, and merging the corresponding nets within the word-level representation.

2. The method of claim 1 wherein the obtaining a bit-level design representation comprises translating the word-level representation of the high-level design.

3. The method of claim 1 further comprising maintaining the map between the word-level representation and the bit-level representation.

4. The method of claim 1 wherein the optimizing further comprises removing redundancy.

5. The method of claim 1 wherein the creating the isomorph comprises taking constants from the bit-level representation and using those constants in the word-level representation.

6. The method of claim 1 further comprising optimizing the word-level representation.

7. The method of claim 6 further comprising translating the optimizing of the word-level representation onto the bit-level representation.

8. The method of claim 7 further comprising iterating between the optimizing the bit-level representation, the lifting the results from the optimizing of the bit-level representation, the optimizing the word-level representation, and translating the optimizing of the word-level representation onto the bit-level representation.

9. The method of claim 6 wherein the optimizing the word-level representation includes re-writing an expression to simplify an equation.

10. The method of claim 9 wherein the re-writing includes removing redundancy in the word-level representation.

11. The method of claim 9 wherein the re-writing includes merging an internal equivalence point.

12. The method of claim 9 wherein the re-writing includes substituting a section of the word-level representation with a section from the bit-level representation.

13. The method of claim 1 wherein the high-level design includes a datapath.

14. The method of claim 1 wherein superfluous terms of the bit-level representation are removed from the word-level representation.

15. The method of claim 1 wherein the word-level representation is rebalanced using mathematical identities to identify equivalences in bit-level equations of the bit-level representation.

16. The method of claim 1 wherein bit-level equations of the bit-level representation are solved to find constant values.

17. The method of claim 1 wherein bit-level equations of the bit-level representation are solved to find equivalences.

18. The method of claim 1 further comprising implementing a semiconductor design based on the lifting.

19. The method of claim 1 further comprising evaluating the bit-level representation and the word-level representation for equivalence.

20. A computer system for design analysis comprising:
a memory which stores instructions;
one or more processors coupled to the memory wherein the one or more processors are configured to:
obtain a high-level design which includes a word-level representation;
obtain a bit-level representation of the high-level design;
determine a map between the word-level representation and the bit-level representation;
optimize the bit-level representation; and
lift results from the optimizing of the bit-level representation and including the results in the word-level representation based on the map wherein lifting includes creating an isomorph of the bit-level representation within the word-level representation and where the creating an isomorph includes mapping bit-level nets to corresponding nets within the word-level representation where the bit-level nets are merged, identifying nets from the bit-level representation that are merged, and merging the corresponding nets within the word-level representation.

21. The system of claim 20 wherein the one or more processors are further configured to maintain the map between the word-level representation and the bit-level representation.

22. The system of claim 20 wherein the creating the isomorph comprises taking constants from the bit-level representation and using those constants in the word-level representation.

23. The system of claim 20 wherein the one or more processors are further configured to: optimize the word-level representation; translate the optimizing of the word-level representation onto the bit-level representation; and iterate between the optimizing the bit-level representation, the lifting the results from the optimizing of the bit-level representation, the optimizing the word-level representation, and translating the optimizing of the word-level representation onto the bit-level representation.

24. A computer program product embodied in a non-transitory computer readable medium for design simulation comprising:
code for obtaining a high-level design which includes a word-level representation;
code for obtaining a bit-level representation of the high-level design;
code for determining a map between the word-level representation and the bit-level representation;
code for optimizing the bit-level representation; and
code for lifting results from the optimizing of the bit-level representation and including the results in the word-level representation based on the map wherein the lifting includes creating an isomorph of the bit-level representation within the word-level representation and where the creating an isomorph includes mapping bit-level nets to corresponding nets within the word-level representation where the bit-level nets are merged, identifying nets from the bit-level representation that are merged, and merging the corresponding nets within the word-level representation.

25. The computer program product of claim 24 further comprising code for maintaining the map between the word-level representation and the bit-level representation.

26. The computer program product of claim 24 wherein the creating the isomorph comprises taking constants from the bit-level representation and using those constants in the word-level representation.

27. The computer program product of claim 24 further comprising: code for optimizing the word-level representation; code for translating the optimizing of the word-level representation onto the bit-level representation; and code for iterating between the optimizing the bit-level representation, the lifting the results from the optimizing of the bit-level representation, the optimizing the word-level representation, and translating the optimizing of the word-level representation onto the bit-level representation.

* * * * *